(12) United States Patent
Asakura et al.

(10) Patent No.: US 10,468,845 B2
(45) Date of Patent: Nov. 5, 2019

(54) ROTARY CONNECTOR

(71) Applicant: ALPS ALPINE CO., LTD., Tokyo (JP)

(72) Inventors: Toshiaki Asakura, Miyagi (JP); Rei Kosaka, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/174,833

(22) Filed: Oct. 30, 2018

(65) Prior Publication Data

US 2019/0067892 A1    Feb. 28, 2019

Related U.S. Application Data

(63) Continuation of application No. PCT/JP2017/007748, filed on Feb. 28, 2017.

(30) Foreign Application Priority Data

May 31, 2016 (JP) .................. 2016-108706

(51) Int. Cl.
*H01R 35/02* (2006.01)
*B60R 16/027* (2006.01)
(Continued)

(52) U.S. Cl.
CPC ......... *H01R 35/025* (2013.01); *B60R 16/027* (2013.01); *H01R 12/61* (2013.01);
(Continued)

(58) Field of Classification Search
CPC ....... H01R 35/025; H01R 12/61; H01K 1/147
(Continued)

(56) References Cited

U.S. PATENT DOCUMENTS 5,919,054 A    7/1999   Herlach et al.
5,951,311 A *  9/1999   Kato .................... H01R 35/025
                                                                      439/164

(Continued)

FOREIGN PATENT DOCUMENTS

JP    S63-137069 U    9/1988
JP    H09-134748      5/1997
(Continued)

OTHER PUBLICATIONS

International Search Report dated May 30, 2017 in PCT/JP2017/007748 filed on Feb. 28, 2017.

*Primary Examiner* — Alexander Gilman
(74) *Attorney, Agent, or Firm* — IPUSA, PLLC

(57) ABSTRACT

A rotary connector includes a rotor, a stator rotatably assembled on the rotor, a main flexible printed circuit having two side edges that are linear and parallel to each other, and wound and coiled within an annular space part formed between the rotor and the stator, a first sub flexible printed circuit mounted on one end part of the main flexible printed circuit, and connecting a connection terminal provided on the one end part and an external connection terminal provided on the rotor, and a second sub flexible printed circuit mounted on another end part of the main flexible printed circuit, and connecting a connection terminal provided on the other end part and an external connection terminal provided on the stator.

16 Claims, 16 Drawing Sheets

(51) Int. Cl.
*H01R 12/61* (2011.01)
*H05K 1/03* (2006.01)
*H05K 1/14* (2006.01)
*B62D 1/16* (2006.01)

(52) U.S. Cl.
CPC ......... *H05K 1/0326* (2013.01); *H05K 1/0346* (2013.01); *H05K 1/147* (2013.01); *B62D 1/16* (2013.01); *H05K 2201/0108* (2013.01); *H05K 2201/0154* (2013.01); *H05K 2201/058* (2013.01)

(58) Field of Classification Search
USPC .......................................................... 439/13
See application file for complete search history.

(56) References Cited

U.S. PATENT DOCUMENTS

| | | | | |
|---|---|---|---|---|
| 6,390,838 B1 * | 5/2002 | Kawamura | .......... | H01R 35/025 439/164 |
| 6,471,529 B2 * | 10/2002 | Oishi | .................... | B60R 16/027 439/164 |
| 6,641,404 B2 * | 11/2003 | Matsuzaki | .......... | H01R 35/025 439/15 |
| 6,764,326 B2 * | 7/2004 | Matsumoto | ............ | H01R 39/64 439/15 |
| 6,780,032 B2 * | 8/2004 | Rhein | .................... | B60R 16/027 439/164 |
| 6,854,977 B2 * | 2/2005 | DuRocher | .......... | H01R 13/6315 280/728.2 |
| 6,962,497 B2 * | 11/2005 | Wade | .................... | B60R 16/027 439/15 |
| 7,104,821 B2 * | 9/2006 | Araki | .................... | B60R 16/027 439/164 |
| 7,175,454 B2 * | 2/2007 | Araki | .................... | H01R 35/025 439/15 |
| 7,775,800 B2 * | 8/2010 | Reischl | ................ | H01R 35/025 439/15 |
| 7,811,108 B2 * | 10/2010 | Oishi | .................... | B60R 16/027 439/15 |
| 8,758,024 B2 * | 6/2014 | Adachi | ................... | H01R 35/04 439/15 |
| 8,834,189 B2 * | 9/2014 | Hirai | .................... | B60R 16/027 439/164 |
| 9,011,162 B2 * | 4/2015 | Sato | ....................... | B60R 16/037 439/15 |
| 9,673,585 B2 * | 6/2017 | Tsushima | .............. | B60R 16/027 |
| 2013/0237099 A1 * | 9/2013 | Takahashi | ............ | H01R 12/592 439/697 |

FOREIGN PATENT DOCUMENTS

| | | |
|---|---|---|
| JP | H10-199649 | 7/1998 |
| JP | 2000-133399 | 5/2000 |
| JP | 2006-100733 | 4/2006 |
| JP | 2013-219007 | 10/2013 |

* cited by examiner

US 10,468,845 B2

ROTARY CONNECTOR

CROSS-REFERENCE TO RELATED APPLICATIONS

This application is a continuation application of International Application No. PCT/JP2017/007748 filed on Feb. 28, 2017 and designated the U.S., which is based upon and claims priority to Japanese Patent Application No. 2016-108706, filed on May 31, 2016, the entire contents of which are incorporated herein by reference.

BACKGROUND OF THE INVENTION

1. Field of the Invention

The present invention relates to a rotary connector for transmitting electrical signals between a rotor and a stator on which the rotor is rotatably assembled, and more particularly to a rotary connector for transmitting electrical signals between a steering shaft and a steering column of a vehicle.

2. Description of the Related Art

A conventionally known rotary connector used in the vehicle, such as an automobile or the like, electrically connects an electric apparatus provided on a steering wheel and an electric apparatus provided on a vehicle body.

The rotary connector includes a movable housing mounted on the steering shaft of the vehicle, a stationary housing mounted on the steering column so that the movable housing is rotatable, and a flat cable accommodated within an annular space part that is formed between the two housings and electrically connects external connection terminals provided on the two housings. This rotary connector is used as an electrical connecting means of the electric apparatus such as a horn circuit, an airbag system, various kinds of operation switches, or the like provided in the steering wheel of the vehicle.

For example, Japanese Laid-Open Patent Publication No. 2013-219007 proposes a rotary connector using a plurality of flat cables for connecting the electric apparatuses described above.

The flat cables proposed in Japanese Laid-Open Patent Publication No. 2013-219007 have the following problems.

In general, the flat cable in most cases uses polyester (PET) as an insulating film that covers band-shaped conductors. There is a problem in that the polyester has a low heat resistance. Accordingly, in distribution of goods using ships or the like, packaging of the flat cable is required so that the insulating film does not deteriorate due to environmental changes.

In addition, because it is difficult to form the band-shaped conductors of the flat cable at a very fine pitch, a plurality of flat cables are required when the number of band-shaped conductors forming signal lines needs to be increased.

In order to solve these problems, it is conceivable to use a flexible printed circuit that has an excellent heat resistance, in place of the flat cable. In many cases, a plurality of flexible printed circuits are arranged side by side on a single sheet base and stored, to improve handling of the flexible printed circuit when assembling the flexible printed circuit.

As an example, Japanese Laid-Open Patent Publication No. 2006-100733 proposes forming a large number of unit substrates on a sheet base. When delivering the unit substrates, the unit substrates are generally delivered in the state in which the unit substrates are formed on the sheet base. When using the unit substrates, the sheet base is divided into the unit substrates, to assemble the unit substrate into a product.

However, in a case in which the unit substrate has a shape that is partially concavo-convex, such as an L-shape or a T-shape, a gap is formed between adjacent unit substrates when the unit substrates are arranged side by side on the sheet base. For this reason, the number of unit substrates that can be cut from the single sheet base decreases, to increase the cost of a FPC component forming the unit substrate, and as a result, make it difficult to reduce the cost of the rotary connector.

SUMMARY OF THE INVENTION

One object of the embodiments of the present invention is to provide a rotary connector that has an excellent heat resistance, and is inexpensive even when a flexible printed wiring substrate on which band-shaped conductors can be formed at a very fine pitch is used as a connecting means of an electrical apparatus.

According to one aspect of the embodiments, a rotary connector includes a rotor; a stator rotatably assembled on the rotor; a main flexible printed circuit having two side edges that are linear and parallel to each other, and wound and coiled within an annular space part formed between the rotor and the stator; a first sub flexible printed circuit mounted on one end part of the main flexible printed circuit, and connecting a connection terminal provided on the one end part and an external connection terminal provided on the rotor; and a second sub flexible printed circuit mounted on another end part of the main flexible printed circuit, and connecting a connection terminal provided on the other end part and an external connection terminal provided on the stator.

According to this structure, the main flexible printed circuits that are used may be arranged on a sheet base without a gap. For this reason, the number of main flexible printed circuits obtained (obtainable number) from the single sheet base can be made large, to reduce the unit price per each main flexible printed circuit.

Preferably, in the rotary connector, a plurality of main flexible printed circuits are provided, and both end parts of each of the plurality of main flexible printed circuits are mounted on the first sub flexible printed circuit and the second sub flexible printed circuit, respectively.

According to this structure, each end part of the plurality of main flexible printed circuits can be connected to one sub flexible printed circuit, to reduce the number of parts. Accordingly, it is possible to reduce the cost of the parts.

In addition, in the operation of connecting each main flexible printed circuit and the sub flexible printed circuit, it is possible to simultaneously set each main flexible printed circuit and the sub flexible printed circuit on a jig, to thereby improve the assembling efficiency.

Preferably, at least one of the first sub flexible printed circuit and the second sub flexible printed circuit is mounted to project in a direction crossing a circumferential direction of the main flexible printed circuit.

According to this structure, in a case in which the end part of the main flexible printed circuit is arranged to project in the direction perpendicular to the circumferential direction of the main flexible printed circuit, it is unnecessary to bend the main flexible printed circuit by 45 degrees, to facilitate a wiring operation on the main flexible printed circuit.

In addition, because it is unnecessary to bend the main flexible printed circuit, there is no inconsistency or the like in the bent position of the main flexible printed circuit, and external connection terminals can be mounted at accurate mounting positions.

Preferably, the main flexible printed circuit, the first sub flexible printed circuit, and the second sub flexible printed circuit are overlapped on a first holding member and a second holding member that are provided with positioning caulking pins, to integrally position and hold the main flexible printed circuit, the first sub flexible printed circuit, and the second sub flexible printed circuit on the first holding member and the second holding member.

According to this structure, a positive connection of the connection terminal of the main flexible printed circuit and the connection terminal of the sub flexible printed circuit can be maintained.

Preferably, a connection terminal of the main flexible printed circuit is connected to a connection terminal provided on each of the first sub flexible printed circuit and the second sub flexible printed circuit, and a slit part is formed in one of the connection terminal of the main flexible printed circuit and the connection terminal of each of the first sub flexible printed circuit and the second sub flexible printed circuit.

According to this structure, the slit part formed in the connection terminal enables observation of a soldered state of each connection terminal, to positively bond each connection terminal by a simple soldering operation.

Preferably, an observation window is provided in each of the first holding member and the second holding member to observe the slit part from outside.

According to this structure, the soldered state of each connection terminal can be observed from the outside through the observation window, to enable positive bonding of each connection terminal by a simple soldering operation.

Preferably, the external connection terminal provided on the rotor is fixed on a rotor-side lead block, and the rotor-side lead block is fixed on a rotor-side connector part of the rotor.

According to this structure, a connector part of an external cable may be fitted to the rotor-side connector part, to connect the external connection terminal provided on the rotor to a connection terminal of an external cable. Hence, a load on the external connection terminal can be reduced.

DESCRIPTION OF THE PREFERRED EMBODIMENTS

First Embodiment

A rotary connector in a first embodiment of the present invention will be described.

Figure 1:
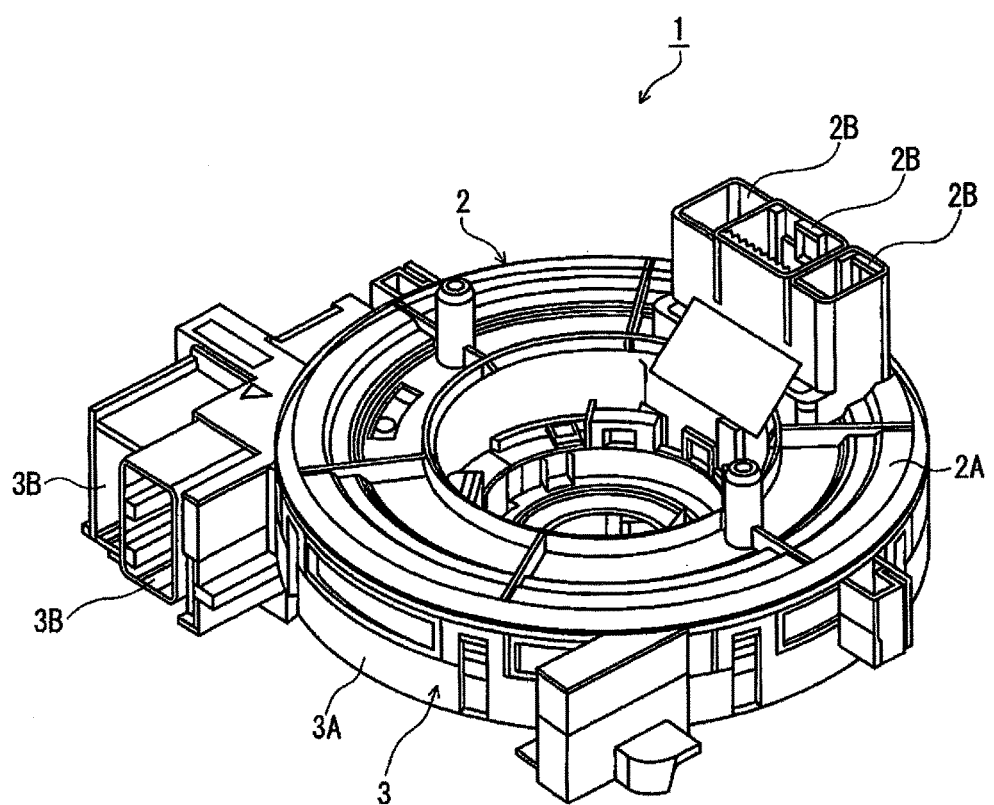
FIG. 1 is a perspective view illustrating an external appearance of a rotary connector in a first embodiment of the present invention.
Figure 2:
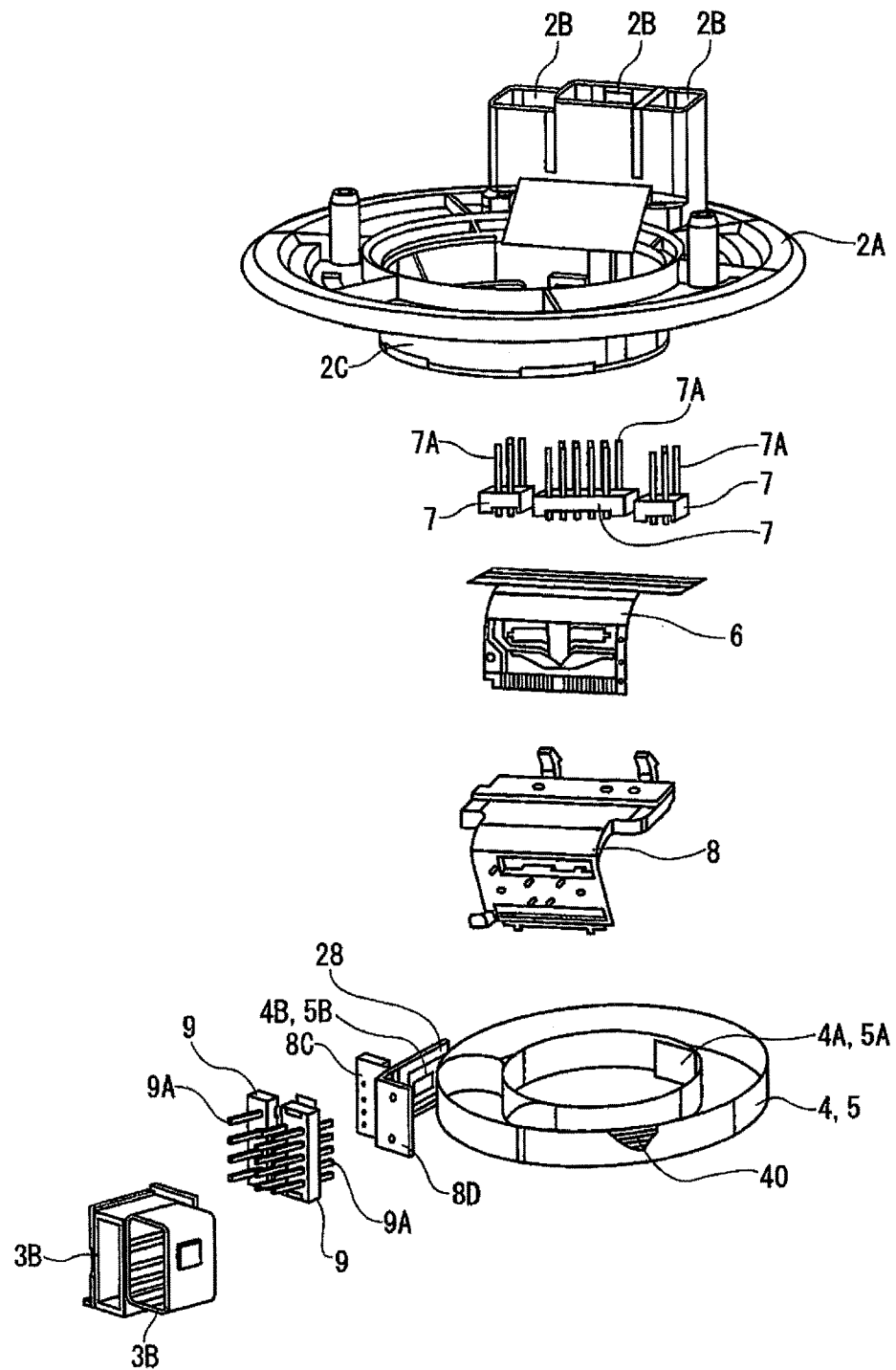
FIG. 2 is a disassembled perspective view of important parts of the rotary connector.

FIG. 1 is a perspective view illustrating an external appearance of the rotary connector in the first embodiment of the present invention. FIG. 2 is a disassembled perspective view of important parts of the rotary connector.

(Entire Structure of Rotary Connector)

A rotary connector 1 is a connecting apparatus for transmitting electrical signals between a steering column (illustration omitted) and a steering shaft (illustration omitted) of a vehicle.

As illustrated in FIG. 1 and FIG. 2, the rotary connector 1 includes an annular rotor 2, and an annular stator 3. The rotor 2 is made of a synthetic resin, and a steering shaft contained in a steering column is inserted through a center part of the rotor 2. The stator 3 is made of a synthetic resin, and the rotor 2 that is mounted on the steering column is rotatably assembled on the stator 3.

An annular space part (illustration omitted) is formed by a combination of the rotor 2 and the stator 3 within a main body of the rotary connector 1. A first main flexible printed circuit (hereinafter referred to as a first main FPC) 4 and a second main flexible printed circuit (hereinafter referred to as a second main FPC) 5 for securing electrical connection between the rotor 2 and the stator 3 are overlapped, wound, and coiled within this annular space part.

Figure 3:
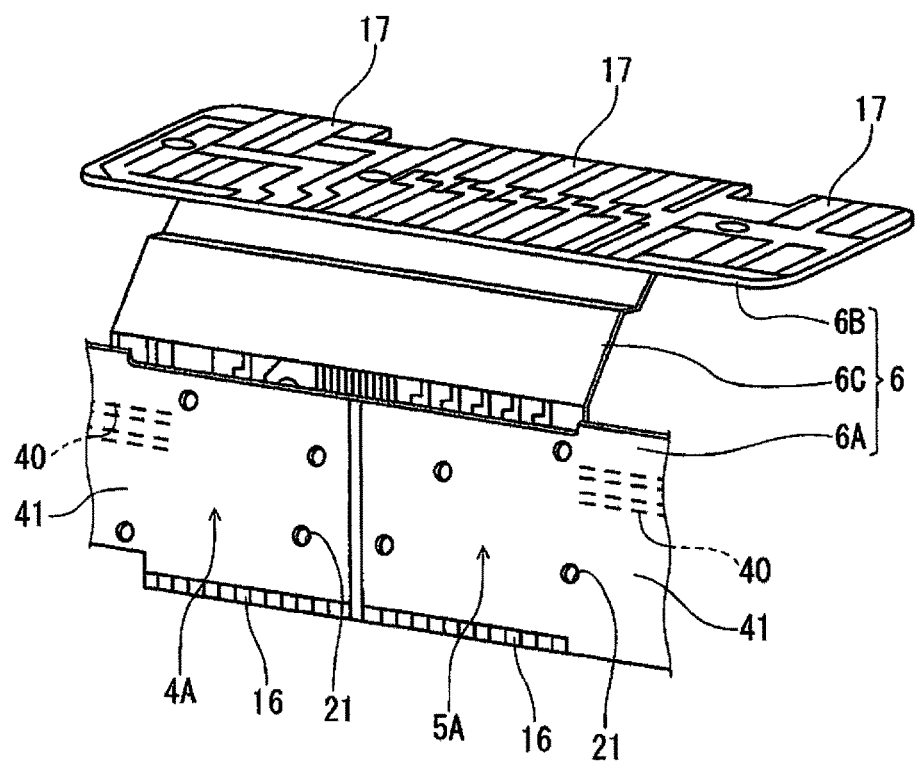
FIG. 3 is an enlarged perspective view illustrating a connection state of a main flexible printed circuit and a first sub flexible printed circuit.

As illustrated in FIG. 3, one end part 4A of the first main FPC 4 and one end part 5A of the second main FPC 5 are mounted on a first flexible printed circuit (hereinafter referred to as a first sub FPC) 6. The first sub FPC 6 is mounted on rotor-side lead blocks 7 respectively having a plurality of external connection terminals 7A.

The rotor-side lead blocks 7 are assembled into rotor-side connector parts 2B that are provided on an upper flange part 2A, via lead block insertion holes (illustration omitted) that are formed to open at an upper flange part 2A of the rotor 2.

According to this structure, connector parts of external cables that are not illustrated may fit into the rotor-side connector parts 2B, to connect the external connection terminals 7A provided on the rotor 2 and connection terminals of the external cables. Hence, a load on the external connection terminals 7A may be reduced.

Figure 4:
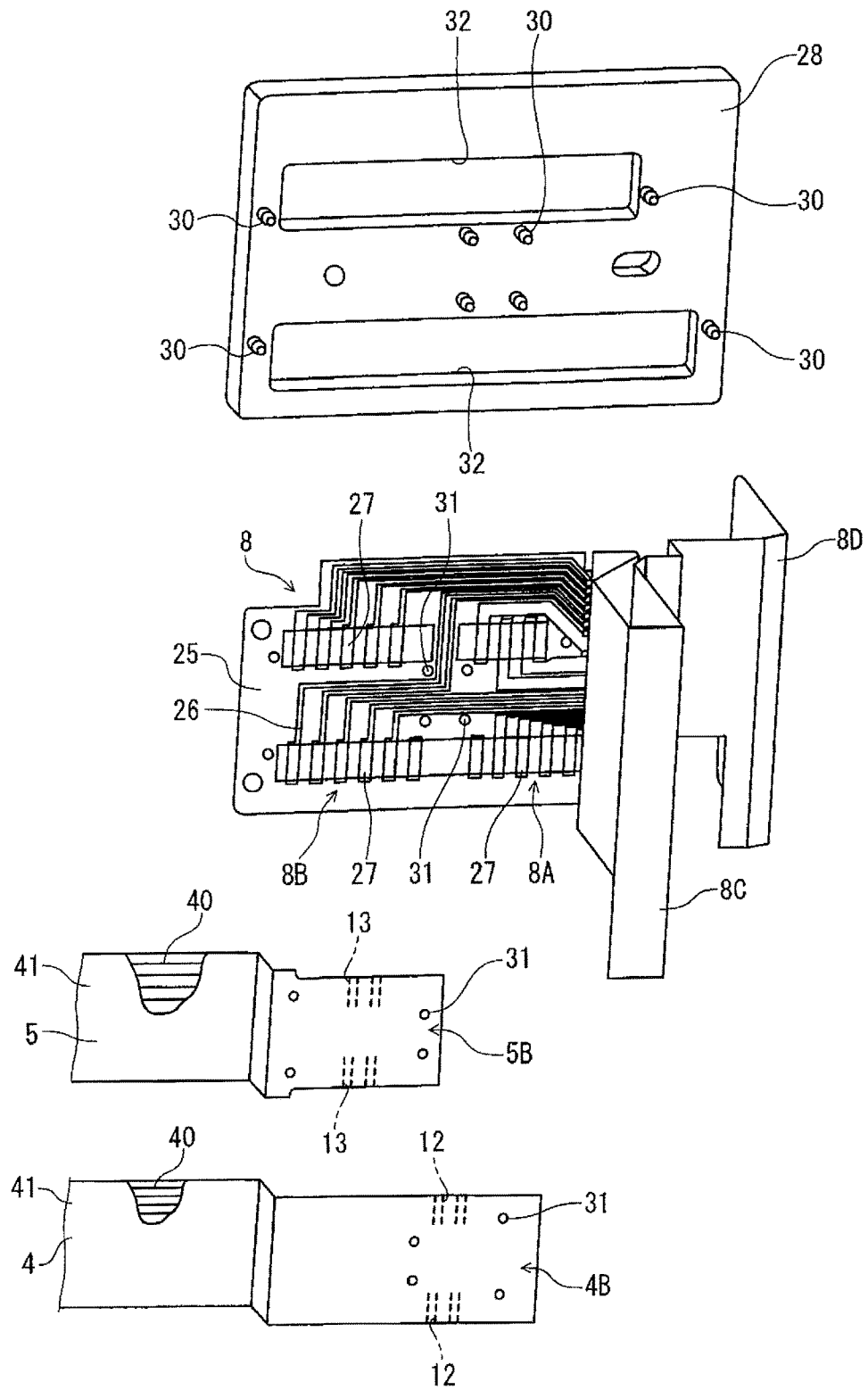
FIG. 4 is an enlarged disassembled perspective view illustrating a connection state of the main flexible printed circuit and a second sub flexible printed circuit.

As illustrated in FIG. 4, another end part 4B of the first main FPC 4 and another end part 5B of the second main FPC 5 are mounted on a second sub flexible printed circuit (hereinafter referred to as a second sub FPC) 8. The second sub FPC 8 is mounted on stator-side lead blocks 9 having a plurality of external connection terminals 9A.

The stator-side lead blocks 9 are assembled into stator-side connector parts 3B that are provided on an outer periphery of a tubular part 3A of the stator 3, via lead block insertion holes (illustration omitted) that are formed to open at the tubular part 3A of the stator 3.

(First Main FPC and Second Main FPC)

The first main FPC 4 is heat resistant, and is formed by a pair of insulating films 41 and 41 that are made of polyimide or the like having transparency, and sandwiching a plurality of band-shaped conductors 40 made of a copper film or the like and arranged in parallel along a width direction. The band-shaped conductors 40 are formed by etching during a process of manufacturing the first main FPC 4 using photolithography. The band-shaped conductors 40 are formed at a very fine pitch.

The first main FPC 4 is formed to an elongated sheet having a length of approximately 50 cm, and having opposing side edges that are linear and parallel to each other. The first main FPC 4 is accommodated within the annular space part and is slidable in the wound and coiled state. By accommodating the first main FPC 4 within the annular space part in the wound and coiled state, it becomes possible to wind or unwind the first main FPC 4, to tolerate a rotation operation of a steering wheel (illustration omitted).

Figure 5:
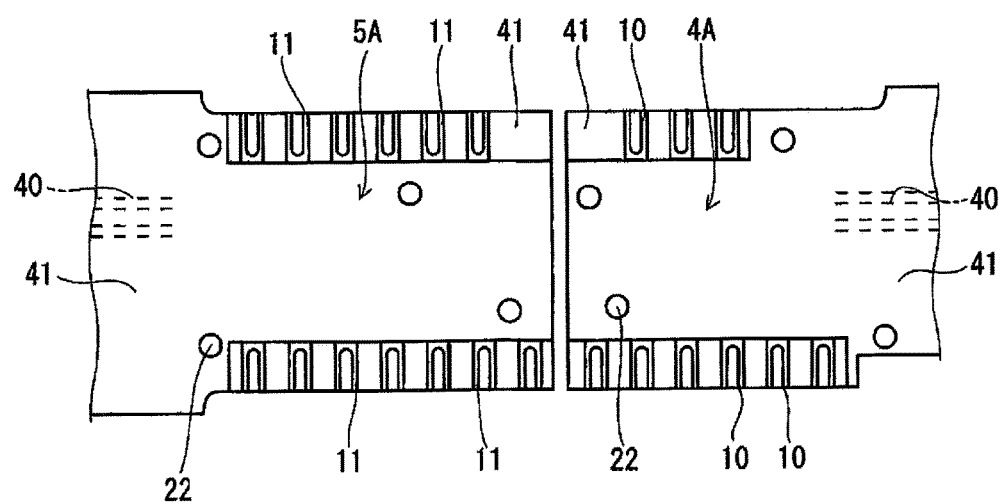
FIG. 5 is a rear view illustrating an end part of the main flexible printed circuit.

As illustrated in FIG. 5, a plurality of connection terminals 10 made of a metal and connected to the band-shaped conductors 40 are arranged in parallel at the one end part 4A of the first main FPC 4. At the one end part 4A of the first main FPC 4, a part of the pair of insulating films 41 and 41 on the rear side of the insulating films 41 is removed to expose the connection terminals 10.

Similarly as in the case of the first main FPC 4, the second main FPC 5 is heat resistant, and is formed by a pair of insulating films 41 and 41 that are made of polyimide or the like having transparency, and sandwiching a plurality of band-shaped conductors 40 made of a copper film or the like and arranged in parallel along a width direction. The band-shaped conductors 40 are formed by etching during a process of manufacturing the second main FPC 5 using photolithography. The band-shaped conductors 40 are formed at a very fine pitch.

Similarly as in the case of the first main FPC 4, the second main FPC 5 is formed to an elongated sheet having a length of approximately 50 cm, and having opposing side edges that are linear and parallel to each other. The second main FPC 5 is accommodated within the annular space part and is slidable in the wound and coiled state. By accommodating the second main FPC 5 within the annular space part in the wound and coiled state, it becomes possible to wind or unwind the second main FPC 5, to tolerate the rotation operation of the steering wheel (illustration omitted).

As illustrated in FIG. 5, a plurality of connection terminals 11 made of a metal and connected to the band-shaped conductors 40 are arranged in parallel at the one end part 5A of the second main FPC 5. At the one end part 5A of the second main FPC 5, a part of the pair of insulating films 41 and 41 on the rear side of the insulating films 41 is removed to expose the connection terminals 11.

(First Sub FPC)

As illustrated in FIG. 3, the first sub FPC 6 is arranged to project in a direction perpendicular to a circumferential direction of each of the main FPCs 4 and 5. The one end parts 4A and 5A of the main FPCs 4 and 5 are butted against each other on a first wiring part 6A of the first sub FPC 6, and each of the main FPCs 4 and 5 is mounted on the first wiring part 6A so that longitudinal directions of of the main FPCs 4 and 5 become linear.

Figure 6:
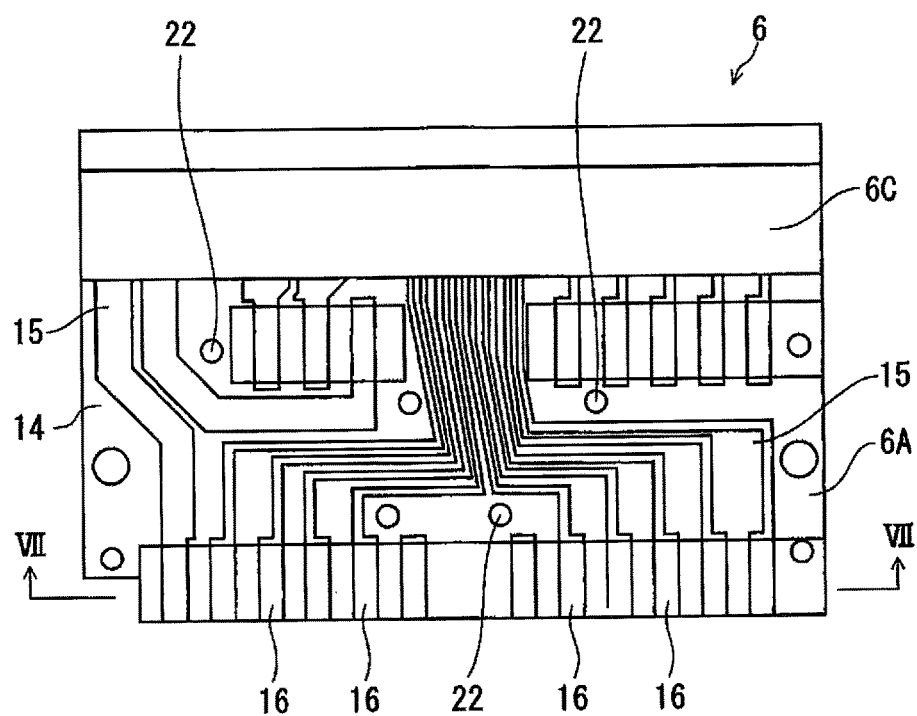
FIG. 6 is an enlarged front view illustrating the first sub flexible printed circuit.
Figure 7:
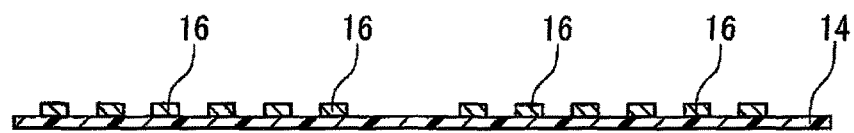
FIG. 7 is a cross sectional view along a line VII-VII in FIG. 6.

As illustrated in FIG. 6 and FIG. 7, the first sub FPC 6 is heat resistant, and is formed by a pair of insulating films 14 and 14 that are made of polyimide or the like having transparency, and sandwiching a plurality of band-shaped conductors 15 made of a copper film or the like and arranged in parallel along a width direction.

The first sub FPC 6 is formed by the first wiring part 6A on which each of the one end parts 4A and 5A of the main FPCs 4 and 5 is mounted, a second wiring part 6B on which the rotor-side lead blocks 7 are mounted, and a third wiring part 6C connecting the first wiring part 6A and the second wiring part 6B.

A plurality of connection terminals 16, that connect to the connection terminals 10 and 11 provided on each of the one end parts 4A and 5A of the main FPCs 4 and 5, are arranged in parallel on the first wiring part 6A. A plurality of connection terminals 17, that connect to the external connection terminals 7A of the rotor-side lead blocks 7, are arranged in parallel on the second wiring part 6B. A plurality of conductors (illustration omitted), that connect between the connection terminals 16 and 17 of the wiring parts 6A and 6B, are arranged on the third wiring part 6C. The plurality of conductors of the third wiring layer 6C are sandwiched and covered by the pair of insulating films 14 and 14.

(First Holding Member)

The rotary connector 1 includes a first holding member 18 for positioning and holding each of the one end parts 4A and 5A of the main FPCs 4 and 5, and the first sub FPC 6. The first holding member 18 is mounted on an outer periphery of a tubular part 2C of the rotor 2. The first holding member 18 is made of a synthetic resin, and is formed to a block body having an L-shape.

Figure 8:
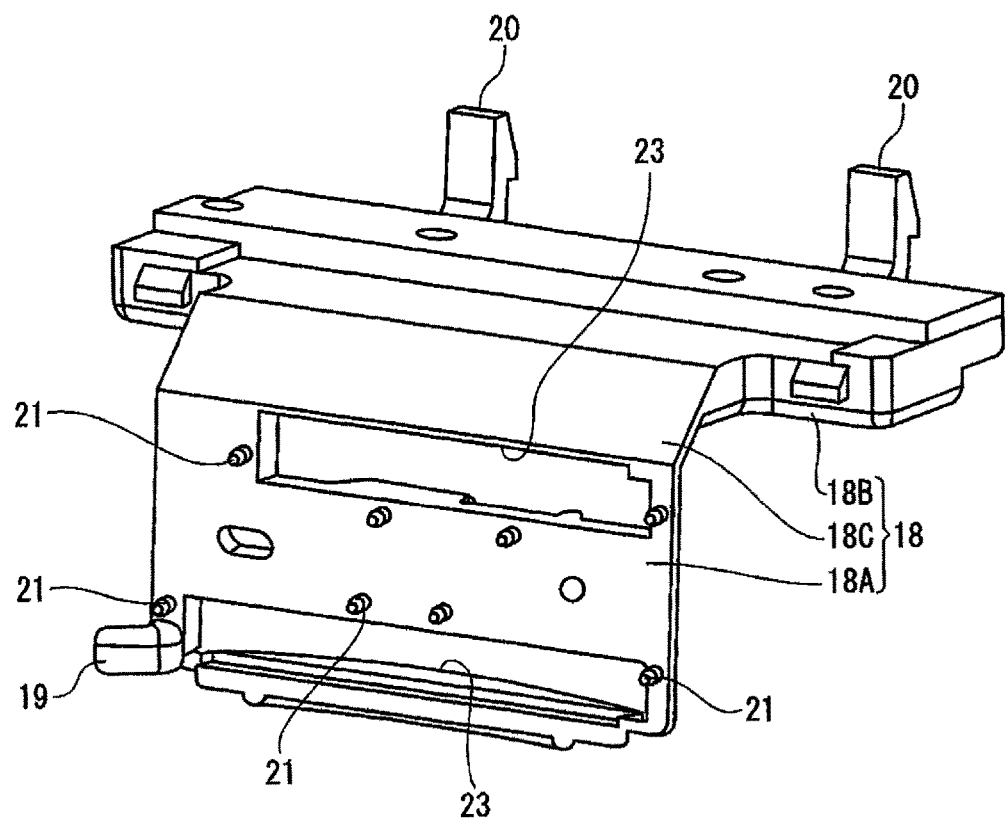
FIG. 8 is an enlarged perspective view illustrating a first holding member.

As illustrated in FIG. 8, the first holding member 18 includes a first holding part 18A for positioning and holding the first wiring part 6A of the first sub FPC 6 and each of the one end parts 4A and 5A of the main FPCs 4 and 5. By overlapping each of the one end parts 4A and 5A of the main FPCs 4 and 5 on the first wiring part 6A that is held on the first holding part 18A, the connection terminals 16 of the first wiring part 6A and the connection terminals 10 and 11 at each of the one end parts 4A and 5A of the main FPCs 4 and 5 are accurately connected at predetermined positions.

In addition, because each of the one end parts 4A and 5A of the main FPCs 4 and 5 is held by the first holding part 18A, each of the FPCs 4 and 5 is accommodated within the annular space part in a state in which each of the main FPCs 4 and 5 is standing in the width direction. Accordingly, each of the main FPCs 4 and 5 can smoothly slide within the annular space part.

The first holding member 18 includes a second holding part 18B for holding the second wiring part 6B of the first sub FPC 6. The rotor-side lead blocks 7 are placed on the second holding part 18B, and the connection terminals 17 of the second wiring part 6B and the connection terminals 7A of the rotor-side lead blocks 7 are connected.

The first holding member 18 includes a third holding part 18C for holding the third wiring part 6C of the first sub FPC 6.

A hook part 19, that is locked by a mounting part (illustration omitted) formed on the tubular part 2C of the rotor 2, is formed on the first holding part 18A of the first holding member 18. In addition, hook parts 20 and 20, that are locked by mounting parts (illustration omitted) formed on the upper flange part 2A of the rotor 2, are formed on the second holding part 18B of the first holding member 18.

In the first holding part 18A of the first holding member 18, a plurality of positioning caulking pins 21 for positioning the first wiring part 6A and the one end parts 4A and 5A of the main FPCs 4 and 5 that are mounted in an overlapping manner on the first wiring part 6A, are provided on a surface on which the first wiring part 6A of the first sub FPC 6 is mounted. A plurality of pin insertion holes 22 into which the positioning caulking pins 21 are inserted, are formed in the first wiring part 6A of the first sub FPC 6 and the one end parts 4A and 5A of each of the main FPCs 4 and 5.

Next, a method of mounting the one end parts 4A and 5A of each of the main FPCs 4 and 5, the first sub FPC 6, and the first holding member 18 will be described.

First, the first sub FPC 6 is arranged on the first holding member 18 so that the connection terminals 16 formed on the first wiring part 6A of the first sub FPC 6 face the front-side.

Then, the first wiring part 6A is pushed against the first holding part 18A, while the positioning caulking pins 21 formed on the first holding part 18A are inserted into the pin insertion holes 22 formed in the first wiring part 6A of the first sub FPC 6. As a result, the first wiring part 6A is positioned at a predetermined position on the first holding part 18A.

Next, the one end parts 4A and 5A of the main FPCs 4 and 5 are arranged on the first wiring part 6A, so that the surface where the connection terminals 10 and 11 of the one end parts 4A and 5A of the main FPCs 4 and 5 are exposed faces a rear-side.

Then, the one end parts 4A and 5A of the main FPCs 4 and 5 are pushed against the first wiring part 6A, while the positioning caulking pins 21 are inserted into the pin insertion holes 22 formed in the one end parts 4A and 5A of the main FPCs 4 and 5. In this state, each of the connection terminals 10 and 11 and each of the connection terminals 16 of the first wiring part 6A are made to overlap via a solder.

Next, tip ends of the positioning caulking pins 21, projecting from the surface of each of the one end parts 4A and 5A of the main FPCs 4 and 5 are caulked.

Accordingly, each of the one end parts 4A and 5A of the main FPCs 4 and 5 and the first wiring part 6A are overlapped on the first holding part 18A, and integrally positioned and held.

Next, the surface of each of the one end parts 4A and 5A of the main FPCs 4 and 5 is pushed against the outer periphery of the tubular part 2C of the rotor 2, together with the rotor-side lead blocks 7 that are connected by solder of a separate reflow process to the first sub FPC 6 on the second holding part 18B of the first holding member 18, to lock each of the hook parts 19 and 20 by the mounting parts provided on the rotor 2. Accordingly, by mounting the first holding member 18 on the outer periphery of the tubular part 2C of the rotor 2, it is possible to mount the one end parts 4A and 5A of the main FPCs 4 and 5 and the first sub FPC 6 at predetermined positions on the rotor 2.

(Connecting Structure of Connection Terminals of First Main FPC and Connection Terminals of First Sub FPC)

Because the connection terminals 10 of the one end part 4A of the first main FPC 4 and the connection terminals 11 of the one end part 5A of the second main FPC 5 have the same structure, the connection terminals 10 of the one end part 4A of the first main FPC 4 will be described, and a description of the connection terminals 11 of the one end part 5A of the second main FPC 5 will be omitted. In addition, because a connecting structure of the connection terminals 10 of the one end part 4A of the first main FPC 4 and the connection terminals 16 of the first wiring part 6A, and a connecting structure of the connection terminals 11 of the one end part 5A of the second main FPC 5 and the connection terminals 16 of the first wiring part 6A are the same, a description of the connecting structure of the connection terminals 11 of the one end part 5A of the second main FPC 5 and the connection terminals 16 of the first wiring part 6A will be omitted.

Figure 9:
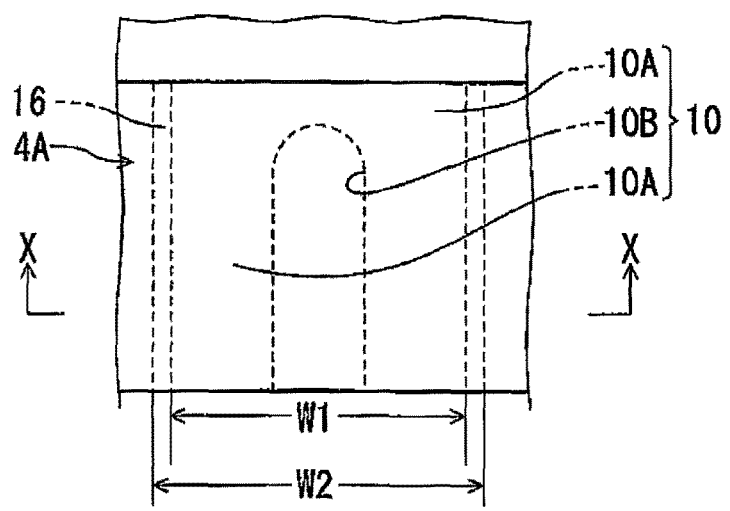
FIG. 9 is an enlarged front view for explaining a bonded state between connection terminals on one end part of the main flexible printed circuit and the first sub flexible printed circuit.

As illustrated in FIG. 5 and FIG. 9, the connection terminals 10 of the one end part 4A of the first main FPC 4 are formed to a U-shape having a pair of mutually opposing terminal pieces 10A and 10A, and and a slit part 10B is formed between the pair of terminal pieces 10A and 10A. A width W1 of the connection terminal 10 of the one end part 4A of the first main FPC 4 is formed narrower than a width W2 of the connection terminal 16 of the first wiring part 16A of the first sub FPC 6.

The connection terminals 10 of the one end part 4A of the first main FPC 4 and the connection terminals 16 of the first wiring part 6A are bonded by melting a solder 24 by a heater tool that is inserted from windows 23 and 23 formed in the first holding part 18A of the first holding member 18.

Figure 10:
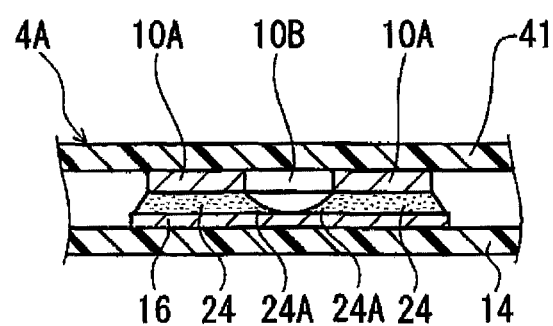
FIG. 10 is a cross sectional view along a line X-X in FIG. 9.

As illustrated in FIG. 10, the solder 24 between the terminals 10 and 16 is divided into two fillet shapes having bottom parts 24A and 24A that spread due to surface tension between the connection terminal 16 of the first wiring part 6A of the first sub FPC 6 and the terminal pieces 10A and 10A of the connection terminal 10 of the one end part 4A of the first main FPC 4. In addition, at the solder 24, the adjacent bottom parts 24A and 24A are positioned by the slit part 10B. The slit part 10B of the connection terminal 10 of the one end part 4A of the first main FPC 4 can be observed visually or observed by a camera from the front-side (upper-side in FIG. 10) of the one end part 4A of the first main FPC 4 through the insulating film 41. In other words, it is possible to observe whether the bottom parts 24A and 24A of the solder 24 exist at the slit part 10B. Accordingly, when the bottom parts 24A and 24A of the solder 24 exist at the slit part 10B, it is possible to confirm that the terminals 10 and 16 are bonded by the solder 24, to thereby enable positive bonding of the terminals 10 and 16 by a simple operation.

(Second Sub FPC)

As illustrated in FIG. 4, the plurality of connection terminals 12 made of a metal and connected to the band-shaped conductors 40 are arranged in parallel at the other end part 4B of the first main FPC 4. The plurality of connection terminals 12 are mounted in an overlapping manner on a first wiring part 8A of the second sub FPC 8. In addition, the plurality of connection terminals 13 made of a metal and connected to the band-shaped conductors 40 are arranged in parallel at the other end part 5B of the second main FPC 5. The plurality of connection terminals 13 are mounted in an overlapping manner on a second wiring part 8B of the second sub FPC 8. The first wiring part 8A and the second wiring part 8B are provided in a continuous manner.

The second sub FPC 8 is heat resistant, and is formed by a sheet-shaped insulating film 25 that is made of polyimide or the like having transparency, and a plurality of conductors 26 made of a copper film or the like and arranged in parallel on the insulating film 25.

A third wiring part 8C and a fourth wiring part 8D to which the two stator-side lead blocks 9 are mounted, are provided on the second sub FPC 8.

A plurality of connection terminals 27 are arranged in parallel on the first wiring part 8A along the longitudinal directions of the main FPCs 4 and 5. A plurality of connection terminals 27 are also arranged in parallel on the second wiring part 8B along the longitudinal directions of the main FPCs 4 and 5.

(Second Holding Member)

The rotary connector 1 includes a second holding member 28 for positioning and holding each of the other end parts 4B and 5B of the main FPCs 4 and 5, and the first wiring part 8A and the second wiring part 8B of the second sub FPC 8. The second holding member 28 is mounted on the outer periphery of the tubular part 3A of the stator 3. The second holding member 28 is made of a synthetic resin, and is formed to a plate shape.

In the second holding member 28, a plurality of positioning caulking pins 30 for positioning the wiring parts 8A and 8B of the second sub FPC 8 and the other end parts 4B and 5B of the main FPCs 4 and 5 that are mounted on the wiring parts 8A and 8B, are provided on a surface on which the first wiring part 8A and the second wiring part 8B of the second sub FPC 8 is mounted. A plurality of pin insertion holes 31 into which the positioning caulking pins 30 are inserted, are formed in the wiring parts 8A and 8B of the second sub FPC 8 and the other end parts 4B and 5B of each of the main FPCs 4 and 5.

Next, a method of mounting each of the other end parts 4B and 5B of the main FPCs 4 and 5, the second sub FPC 8, and the second holding member 28 will be described.

First, the second sub FPC 8 is arranged on the second holding member 28 so that the surface having the connection terminals 27 formed on the wiring parts 8A and 8B of the second sub FPC 8 faces the front-side.

Then, the wiring parts 8A and 8B are pushed against the second holding member 28, while inserting the positioning caulking pins 30 formed on the second holding member 28 are inserted into the pin insertion holes 31 formed in the wiring parts 8A and 8B of the second sub FPC 8. As a result, each of the wiring parts 8A and 8B is positioned at a predetermined position on the second holding member 28.

Next, the other end parts 4B and 5B of the main FPCs 4 and 5 are arranged on the wiring parts 8A and 8B, so that a surface where the connection terminals 12 and 13 of the other end parts 4B and 5B of the main FPCs 4 and 5 are exposed faces the rear-side (the side of each of the wiring parts 8A and 8B).

Then, the other end parts 4B and 5B of the main FPCs 4 and 5 are pushed against the wiring parts 8A and 8B, while inserting the positioning caulking pins 30 into the pin insertion holes 31 formed in the other end parts 4B and 5B of the main FPCs 4 and 5. In this state, each of the connection terminals 12 and 13 and each of the connection terminals 27 of the wiring parts 8A and 8B are made to overlap via a solder.

Next, tip ends of the positioning caulking pins 30, projecting from the surface of each of the other end parts 4B and 5B of the main FPCs 4 and 5 are caulked.

Accordingly, each of the other end parts 4B and 5B of the main FPCs 4 and 5 and the wiring parts 8A and 8B are overlapped on the second holding member 28, and integrally positioned and held.

Next, by mounting the second holding member 28 on the outer periphery of the tubular part 3A of the stator 3, the other end parts 4B and 5B of the main FPCs 4 and 5 and the second sub FPC 8 can be mounted at predetermined positions on the stator 2.

(Connecting Structure of Connection Terminals of First Main FPC and Connection Terminals of Second Sub FPC)

The connection terminals 12 of the other end part 4B of the first main FPC 4 and the connection terminals 13 of the other end part 5B of the second main FPC 5 have the same structure. Hence, the connection terminals 12 of the other end part 4B of the first main FPC 4 will be described, and a description of the connection terminals 13 of the other end part 5B of the second main FPC 5 will be omitted.

In addition, a connecting structure of the connection terminals 12 of the other end part 4B of the first main FPC 4 and the connection terminals 27 of the first wiring part 8A, and a connecting structure of the connection terminals 13 of the other end part 5B of the second main FPC 5 and the connection terminals 27 of the second wiring part 8B are the same. Further, a connecting structure of the connection terminals 12 of the other end part 4B of the first main FPC 4 and the connection terminals 27 of the first wiring part, and a connecting structure of the connection terminals 10 of the one end part 4A of the first main FPC 4 and the connection terminals 16 of the first wiring part 6A are the same. Hence, a detailed description of the connecting structure of the connection terminals 12 and 27, and the connecting structure of the connection terminals 13 and 27 will be omitted.

Figure 11:
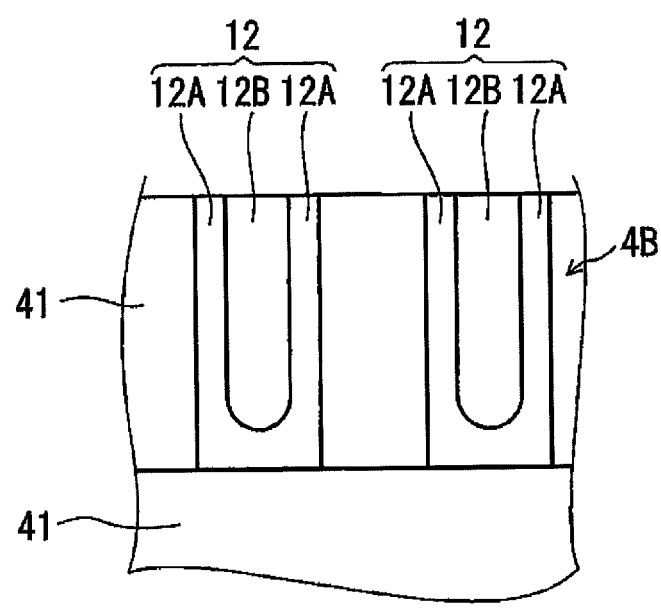
FIG. 11 is an enlarged rear view for explaining connection terminals on another end part of the main flexible printed circuit.

FIG. 11 is a rear view of the connection terminals 12 of the other end part 4B of the first main FPC 4. The connection terminals 12 of the other end part 4B of the first main FPC 4 are formed to a U-shape having a pair of mutually opposing terminal pieces 12A and 12A, and and a slit part 12B is formed between the pair of terminal pieces 12A and 12A.

The connection terminals 12 of the other end part 4B of the first main FPC 4 and the connection terminals 27 of the first wiring part 8A of the second sub FPC 8 are bonded by melting a solder by a heater tool that is inserted from windows 32 and 32 formed in the second holding member 28, similarly to the above described bonding of the rotor-side connection terminals 12 and the connection terminals 16 of the first sub FPC 6.

The bonded state of the connection terminals of the other end part 4B of the first main FPC 4 and the connection terminals 27 of the second sub FPC 8 may be confirmed by observing whether bottom parts of the solder exist at the slit part 12B, similarly as in the case of the rotor-side connection terminals 10 described above. In other words, when the bottom parts of the solder exist at the slit part 12B, it may be confirmed that the connection terminals 12 and 27 are bonded by the solder, and thus enable positive bonding of the connection terminals 12 and 27 by a simple bonding operation.

Hence, according to the rotary connector 1 in this embodiment, a flexible printed circuit that is sufficiently heat resistant and has an elongated shape with opposing side edges that are linear and parallel to each other may be used for each of the main FPCs 4 and 5. Hence, the main flexible printed circuits that are used may be arranged on a sheet base without a gap. For this reason, the number of main flexible printed circuits obtained (obtainable number) from the single sheet base can be made large, to reduce the unit price per each main flexible printed circuit. As a result, it is possible to provide an inexpensive rotary connector even when the flexible printed circuit is used as a wiring means.

In addition, according to the rotary connector 1 in this embodiment, the one end parts 4A and 5A of the two main FPCs 4 and 5 can be mounted on the single first sub FPC 6, and the other end parts 4B and 5B of the two main FPCs 4 and 5 can be mounted on the single second sub FPC 8. For this reason, it is possible to reduce the number of parts, and reduce the cost of the parts.

Further, in the operation of connecting the main FPCs 4 and 5 and each of the sub FPCs 6 and 8, it is possible to simultaneously set the main FPCs 4 and 5 and each of the sub FPCs 6 and 8 on a jig, to thereby improve the assembling efficiency.

In this embodiment, a description is given of an example in which two main FPCs 4 and 5 are used. However, the present invention may be applied to a case in which a single main FPC is used, or three or more main FPCs are used.

In addition, according to the rotary connector 1 in this embodiment, the first sub FPC 6 is mounted to project in a direction perpendicular to the circumferential direction of each of the main FPCs 4 and 5. Hence, in a case in which the one end parts 4A and 5A of the main FPCs 4 and 5 are arranged to project in the direction perpendicular to the circumferential direction of each of the main FPCs 4 and 5, it is unnecessary to bend the one end parts 4A and 5A of the main FPCs 4 and 5 by 45 degrees, to facilitate a wiring operation on the FPC. Further, because it is unnecessary to bend the main FPCs 4 and 5, there is no inconsistency or the like in the bent position of each of the main FPCs 4 and 5, and the external connection terminals 7A can be mounted at accurate mounting positions.

In one embodiment of the present invention, the second sub FPC 8 may have a structure such that the second sub FPC 8 is mounted in a direction perpendicular to the circumferential direction of each of the main FPCs 4 and 5.

Further, although this embodiment describes an example in which the first sub FPC 6 is arranged in a direction perpendicular to the circumferential direction of each of the main FPCs 4 and 5, the second sub FPC in one embodiment of the present invention may be mounted obliquely to the circumferential direction of the main FPC, in a direction crossing the circumferential direction of the main FPC.

In addition, according to the rotary connector 1 in this embodiment, by caulking the positioning caulking pins 21 provided on the first holding part 18A of the first holding member 18, it is possible to integrally position and hold the one end parts 4A and 5A of the main FPCs 4 and 5 and the first wiring part 6A of the first sub FPC 6. As a result, the connection of the connection terminals 10 and the connection terminals 16 can be positively maintained, and the connection of the connection terminals 11 and the connection terminals 16 can be positively maintained.

Further, according to the rotary connector 1 in this embodiment, the soldered state (bonded state) of each connection terminal can be observed through the slit parts 10B and 12B formed in the connection terminals 10 and 12, to enable positive bonding of each connection terminal by a simple soldering operation.

This embodiment describes an example in which the slit parts 10B and 12B are formed in the connection terminals 10 and 12 of the main FPCs 4 and 5. However, the present invention may be applied to a case in which the slit parts are formed in the connection terminals 16 and 27 of the first sub FPC 6 and the second sub FPC 8. In other words, the slit parts may be formed in either the connection terminals 10 and 12 of the main FPCs 4 and 5, or the connection terminals 16 and 27 of the first sub FPC 6 and the second sub FPC 8.

In addition, the solder is separately heated by the heater tool or by the reflow process or the like, in order to connect the connection terminals by the solder. However, any other suitable means may be used as long as the mechanical and electrical connection can be achieved after heating and cooling the solder.

Second Embodiment

A rotary connector 50 in a second embodiment of the present invention will be described, by referring to FIG. 12 through FIG. 16. In the rotary connector 50 in this embodiment, a connecting structure of a first main FPC 51, a second main FPC 52, a first sub FPC 53, and a holding member 57 differs from the connecting structure of the rotary connector 1 in the first embodiment. A structure of the rotary connector 50, other than the connecting structure, is basically the same as the structure of the rotary connector 1 in the first embodiment, and those parts that are the same are described using the same reference numerals. The connecting structure of the rotary connector 50 in this embodiment will be described in the following.

Figure 12:
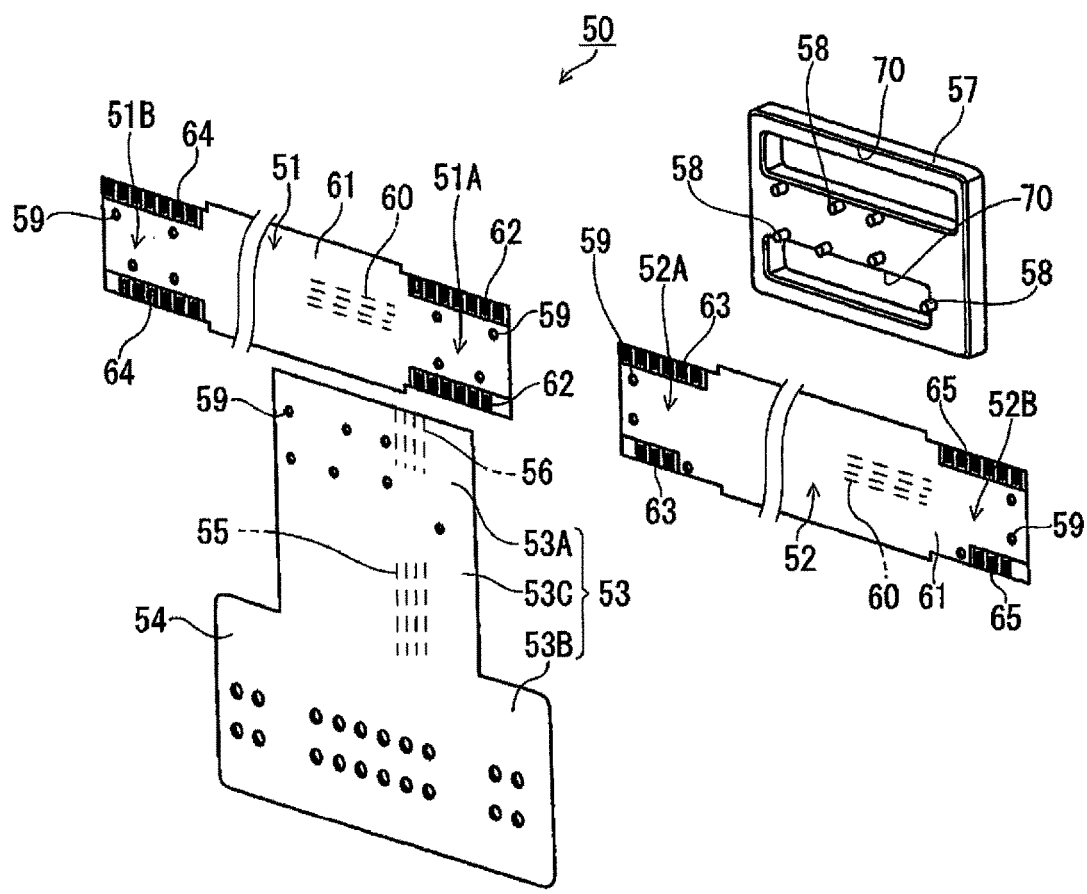
FIG. 12 is a disassembled perspective view illustrating important parts of the rotary connector in a second embodiment of the present invention.
Figure 13:
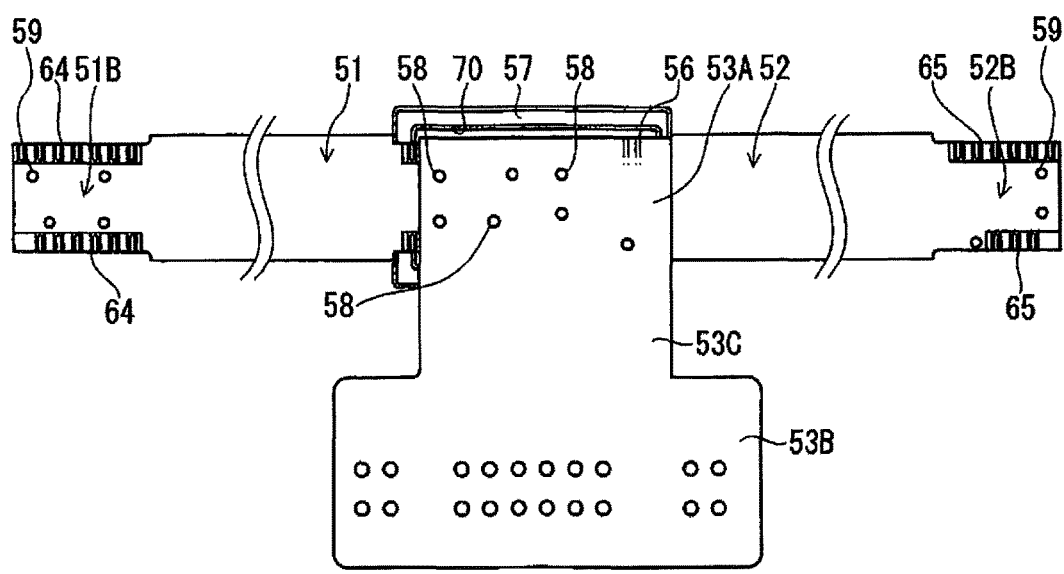
FIG. 13 is a front view illustrating important parts in a mounted state of the main flexible printed circuits and the sub flexible printed circuit.
Figure 14:
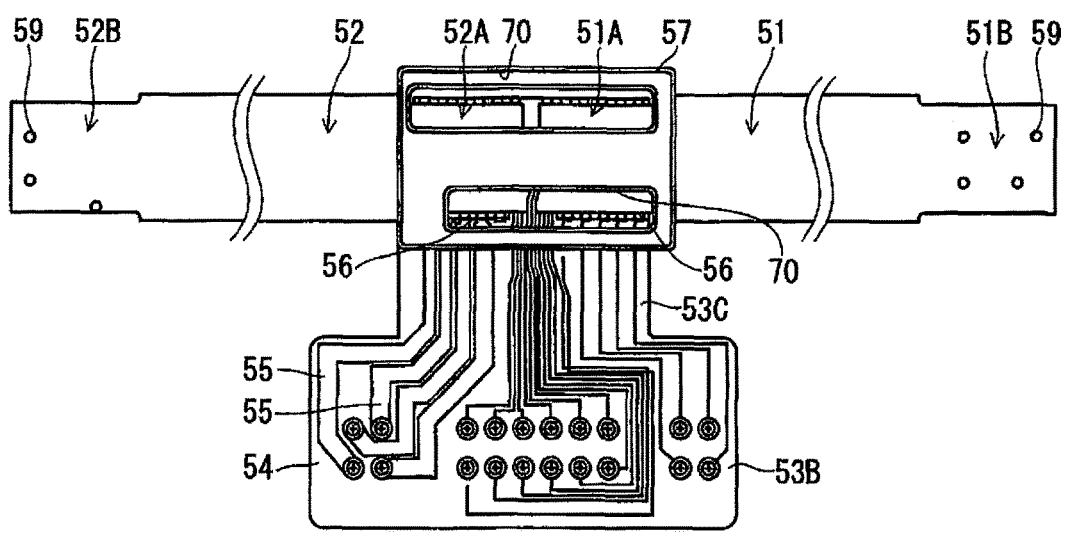
FIG. 14 is a rear view illustrating the important parts in the mounted state of the main flexible printed circuits and the sub flexible printed circuit.

FIG. 12 is a disassembled perspective view illustrating important parts of the rotary connector in the second embodiment of the present invention. FIG. 13 is a front view illustrating important parts in a mounted state of the main FPCs and the sub FPC of the rotary connector. FIG. 14 is a rear view illustrating the important parts in the mounted state of the main FPCs and the sub FPC of the rotary connector.

The rotary connector 50 includes the first main FPC 51 and the second main FPC 52 for securing electrical connection between the rotor 2 and the stator 3.

(First Main FPC and Second Main FPC)

The first main FPC 51 and the second main FPC 52 are heat resistant, and are each formed by a pair of insulating films 61 and 61 that are made of polyimide or the like having transparency, and sandwiching a plurality of band-shaped conductors 60 made of a copper film or the like and arranged in parallel along a width direction. Each of the main FPCs 51 and 52 has a length of approximately 50 cm, and has opposing side edges that are linear and parallel to each other.

The band-shaped conductors 60 are formed by etching during a process of manufacturing the main FPCs 51 and 52 using photolithography. The band-shaped conductors 60 are formed at a very fine pitch.

The main FPCs 51 and 52 are overlapped, wound, and coiled within an annular space part formed in a main body of the rotary connector 50. The main FPCs 51 and 52 accommodated within the annular space part are slidable in the wound and coiled state.

A plurality of connection terminals 62 made of a metal and connected to the band-shaped conductors 60 are arranged in parallel on one end part 51A of the first main FPC 51. In the one end part 51A of the first main FPC 51, a part of the pair of insulating films 61 and 61 on the rear side of the insulating films 61 is removed to expose the connection terminals 62 of the one end part 51A of the first main FPC 51.

A plurality of connection terminals 63 made of a metal and connected to the band-shaped conductors 60 are arranged in parallel on one end part 52A of the second main FPC 52. In the one end part 52A of the second main FPC 52, a part of the pair of insulating films 61 and 61 on the rear side of the insulating films 61 is removed to expose the connection terminals 63 of the one end part 52A of the second main FPC 52.

(Sub FPC)

The first sub FPC 53 is arranged to project in a direction perpendicular to the circumferential direction of each of the main FPCs 51 and 52. The one end part 51A of the first main FPC 51 and the one end part 52A of the second main FPC 52 are butted against each other on a first wiring part 53A of the first sub FPC 53, which will be described later, and each of the main FPCs 51 and 52 is mounted on the first wiring part 53A so that longitudinal directions of of the main FPCs 51 and 52 become linear.

The first sub FPC 53 is heat resistant, and is formed by a sheet-shaped insulating film 54 that is made of polyimide or the like having transparency, and a plurality of conductors 55 made of a copper film or the like and arranged in parallel on the insulating film 54.

The sub FPC 53 is formed by a first wiring part 53A mounted on the one end parts 51A and 52A of the main FPCs 51 and 52, a second wiring part 53B mounted on a rotor-side lead block (illustration omitted), and a third wiring part 53C connecting the first wiring part 53A and the second wiring part 53B. A plurality of connection terminals 56 are arranged on the first wiring part 53A in parallel along a width direction.

(Holding Member)

The rotary connector 50 includes the holding member 57 that positions and holds each of the one end parts 51A and 52A of the main FPCs 51 and 52 and the first FPC 53. The holding member 57 is made of a synthetic resin, and is formed to a plate shape.

In the holding part 57, a plurality of positioning caulking pins 58 for positioning and fixing each of the one end parts 51A and 52A and the first wiring part 53A of the first sub FPC 53, are provided on a surface on which the one end parts 51A and 52A of the main FPCs 51 and 52 are mounted. A plurality of pin insertion holes 59 into which the positioning caulking pins 58 are inserted, are formed in the one end parts 51A and 52A and the first wiring part 53A.

The one end parts 51A and 52A of the main FPCs 51 and 52 and the first wiring part 53A are mounted on the holding member 57 in the following manner. The holding member 57 is mounted on the outer periphery of the rotor 2.

First, the one end parts 51A and 52A of the main FPCs 51 and 52 are arranged on the holding member 57 so that the surface where the connection terminals 62 and 63 of the one end parts 51A and 52A are exposed faces the front-side.

Next, the one end parts 51A and 52A are pushed against the holding member 57, while the positioning caulking pins 58 formed on the holding member 57 are inserted into the pin insertion holes 59 formed in the one end parts 51A and 52A. As a result, the one end parts 51A and 52A are positioned at predetermined positions on the holding member 57.

Then, the surface of the first wiring part 53A where the connection terminals 56 are exposed is arranged to face the rear-side (the side of each of the one end parts 51A and 52A of the main FPCs 51 and 52). Next, the first wiring part 53A is pushed against each of the one end parts 51A and 52A, while inserting the positioning caulking pins 58 into the pin insertion holes 59 formed in the first wiring part 53A. In this state, each of the connection terminals 62 and 63 and each of the connection terminals 56 of the first wiring part 53A are made to overlap via a solder.

Next, tip ends of the positioning caulking pins 58, projecting from the surface of each of the one end parts 51A and 52A of the main FPCs 51 and 52 are caulked.

Accordingly, each of the one end parts 51A and 52A of the main FPCs 51 and 52 and the first wiring part 53A are overlapped on the holding member 57, and integrally positioned and held.

(Connecting Structure of Connection Terminals of Main FPC and Connection terminals of Sub FPC)

Because the connection terminals 62 of the one end part 51A of the first main FPC 51 and the connection terminals 63 of the one end part 52A of the second main FPC 52 have the same structure, the connection terminals 62 of the one end part 51A of the first main FPC 51 will be described, and a description of the connection terminals 63 of the one end part 52A of the second main FPC 52 will be omitted.

In addition, because a connecting structure of the connection terminals 62 of the one end part 51A of the first main FPC 51 and the connection terminals 56 of the first wiring part 53A, and a connecting structure of the connection terminals 63 of the one end part 52A of the second main FPC 52 and the connection terminals 56 of the first wiring part 53A are the same, a description of the connecting structure of the connection terminals 63 of the one end part 52A of the second main FPC 52 and the connection terminals 56 of the first wiring part 53A will be omitted.

Figure 15:
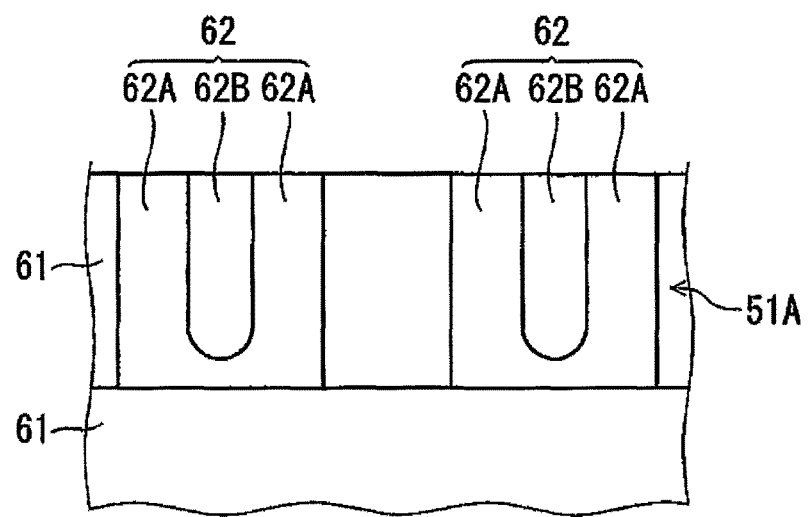
FIG. 15 is an enlarged rear view for explaining connection terminals on one end part of the main flexible printed circuit.

As illustrated in FIG. 15, the connection terminals 62 of the one end part 51A of the first main FPC 51 are formed to a U-shape having a pair of mutually opposing terminal pieces 62A and 62A, and and a slit part 62B is formed between the pair of terminal pieces 62A and 62A. Observation windows 70 and 70 are formed in the holding member 57.

The connection terminals 62 of the one end part 51A of the first main FPC 51 and the connection terminals formed on the first wiring part 53A are bonded by melting the solder 24 by the heater tool that is inserted from the observation windows 70 and 70 formed in the rear-side of the holding member 57.

Figure 16:
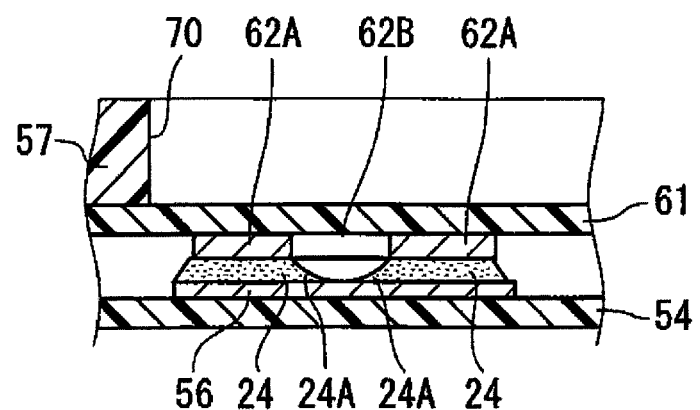
FIG. 16 is a schematic view for explaining a bonded state of the connection terminals on the one end part of the main flexible printed circuit.

As illustrated in FIG. 16, the solder 24 between the connection terminals 62 and 56 is divided into two fillet shapes having the bottom parts 24A and 24A that spread due to surface tension between the connection terminal 56 of the first wiring part 53A and the terminal pieces 62A and 62A of the connection terminal 62 of the one end part 51A of the first main FPC 51. In addition, at the solder 24, the adjacent bottom parts 24A and 24A are positioned by the slit part 62B.

The slit part 62B of the connection terminal 62 of the one end part 51A of the first main FPC 51 can be observed visually or observed by a camera from the rear-side of the holding member 57 through the observation window 70. In other words, it is possible to observe whether the bottom parts 24A of the solder 24 exist at the slit part 62B. Accordingly, when the bottom parts 24A of the solder 24 exist at the slit part 62B, it is possible to confirm that the terminals 62 and 56 are bonded by the solder 24, to thereby enable positive bonding of the terminals 62 and 56 by a simple operation.

Each of the other end parts 51B and 52B of the main FPCs 51 and 52 is mounted on the second sub FPC (illustration omitted). Each of the other end parts 51B and 52B and the second sub FPC are positioned and held by a holding member (illustration omitted).

In addition, connection terminals 64 and 65 of the other end parts 51B and 52B of the main FPCs 51 and 52 are formed to a U-shape, similarly to the connection terminals 62 of the one end part 51A of the first main FPC 51. Further, the connection terminals 64 and 65 are bonded to connection terminals (illustration omitted) of the sub FPC (illustration omitted), similarly to the connection terminals 62 and 63 that are bonded to the connection terminals 56 of the first sub FPC 53.

According to the rotary connector 50 in the second embodiment, the observation window 70 is provided in the holding member 57, to observe the slit part 62B of the connection terminals 62 of the first main FPC 51. Hence, the soldered state of the connection terminals 62 of the one end part 51A of the first main FPC 51 and the connection terminals 56 of the first sub FPC 53 can be observed from the outside through the observation window 70, and it is possible to positively bond the connection terminals 62 and 56 by a simple bonding operation.

According to the embodiments of the present invention, it is possible to provide a rotary connector that has an excellent heat resistance, and is inexpensive even when a flexible printed wiring substrate on which band-shaped conductors can be formed at a very fine pitch is used as a connecting means of an electrical apparatus.

Although the embodiments are numbered with, for example, "first," or "second," the ordinal numbers do not imply priorities of the embodiments.

The present invention is not limited to the embodiments described above. In other words, it is apparent to those skilled in the art that various variations, combinations, sub-combinations, and substitutions may be made to the structures of the embodiments described above without departing from the scope of the present invention.

For example, the present invention is applicable to a rotary connector for transmitting electrical signals between an annular stator and a rotor that is rotatably assembled on the annular stator.

What is claimed is:

1. A rotary connector comprising:
a rotor having a first external connection terminal;
a stator, rotatably assembled on the rotor, and having a second external connection terminal;
a main flexible printed circuit wound and coiled within an annular space part formed between the rotor and the stator, the main flexible printed circuit having a first end part including a first connection terminal, a second end part opposite to the first end part and including a second connection terminal, and two side edges that extend from the first end part to the second end part and are linear and parallel to each other;
a first sub flexible printed circuit having a first wiring part including a first terminal electrically connected to the first connection terminal in the first end part of the main flexible printed circuit, and a second wiring part including a second terminal electrically connected to the first external connection terminal of the rotor;
a second sub flexible printed circuit having a third wiring part including a third terminal electrically connected to the second connection terminal in the second end part of the main flexible printed circuit, and a fourth wiring part including a fourth terminal electrically connected to the second external connection terminal of the stator;
a first holding member, provided on the rotor, and including a first holding part configured to position and hold the first end part of the main flexible printed circuit and the first wiring part of the first sub flexible printed circuit, and a second holding part configured to hold the second wiring part of the first sub flexible printed circuit and electrically connect the second terminal to the first external terminal; and
a second holding member, provided on the stator, and configured to position and hold the second end part of the main flexible printed circuit and the second sub flexible printed circuit.

2. The rotary connector as claimed in claim 1, wherein a plurality of main flexible printed circuits are provided, and the first and second end parts of each of the plurality of main flexible printed circuits are mounted on the first sub flexible printed circuit and the second sub flexible printed circuit, respectively.

3. The rotary connector as claimed in claim 1, wherein at least one of the first sub flexible printed circuit and the second sub flexible printed circuit is mounted to project in a direction crossing a circumferential direction of the main flexible printed circuit.

4. The rotary connector as claimed in claim 1, wherein:
the main flexible printed circuit and the first sub flexible printed circuit overlap on the first holding member, and the main flexible printed circuit and the second sub flexible printed circuit overlap on the second holding member,
the first holding member includes positioning caulking pins, to integrally position and hold the main flexible printed circuit and the first sub flexible printed circuit on the first holding member, and
the second holding member includes positioning caulking pins, to integrally position and hold the main flexible printed circuit and the second sub flexible printed circuit on the second holding member.

5. The rotary connector as claimed in claim 1, wherein at least one of the first and second connection terminals of the main flexible printed circuit has a U-shape with a first pair of mutually opposing terminal pieces, and a first slit part formed between the first pair of terminal pieces.

6. The rotary connector as claimed in claim 5, wherein each of the first holding member and the second holding member includes an observation window so that the first slit part is observable from outside the first holding member and the second holding member through the observation window.

7. The rotary connector as claimed in claim 5, wherein at least one of the first and second terminals of the first sub flexible printed circuit has a U-shape with a second pair of mutually opposing terminal pieces, and a second slit part formed between the second pair of terminal pieces.

8. The rotary connector as claimed in claim 7, wherein at least one of the third and fourth connection terminals of the second sub flexible printed circuit has a U-shape with a third pair of mutually opposing terminal pieces, and a third slit part formed between the third pair of terminal pieces.

9. The rotary connector as claimed in claim 1, further comprising:
a rotor-side lead block to which the first external connection terminal of the rotor is fixed; and
a rotor-side connector part, provided on the rotor, and to which the rotor-side lead block is fixed.

10. The rotary connector as claimed in claim 1, further comprising:
a flange part provided on the rotor;
a rotor-side connector part provided on the flange part; and
a rotor-side lead block, having the first external connection terminal provided on the rotor, and assembled into the rotor-side connector part, wherein the first sub flexible printed circuit is mounted on the rotor-side lead block, and wherein the rotor-side connector part is configured to receive a connector of an external cable, to electrically connect the first external connection terminal provided on the rotor and a connection terminal of the external cable.

11. The rotary connector as claimed in claim 1, wherein the first sub flexible printed circuit further includes a fifth wiring part electrically connecting the first wiring part and the second wiring part.

12. The rotary connector as claimed in claim 11, wherein the first holding member further includes a third holding part configured to hold the fifth wiring part of the first sub flexible printed circuit.

13. The rotary connector as claimed in claim 1, further comprising:

two stator-side lead blocks, wherein the second sub flexible printed circuit further includes a pair of wiring parts to which the two stator-side lead blocks are mounted.

14. The rotary connector as claimed in claim 13, further comprising:

a rotor-side lead block, separate from the two stator-side lead blocks, and provided on the second holding part, wherein the second connection terminal of the second wiring part is electrically connected to the first external connection terminal of the rotor-side lead block.

15. The rotary connector as claimed in claim 1, wherein the second holding member positions and holds the second end part of the main flexible printed circuit, and the third wiring part and the fourth wiring part of the second sub flexible printed circuit.

16. The rotary connector as claimed in claim 1, wherein the main flexible printed circuit, the first sub flexible printed circuit, the second sub flexible printed circuit, the first holding member, and the second holding member are mutually separate components.

* * * * *